United States Patent
Brandinger

(10) Patent No.: US 6,696,008 B2
(45) Date of Patent: Feb. 24, 2004

(54) MASKLESS LASER BEAM PATTERNING ABLATION OF MULTILAYERED STRUCTURES WITH CONTINUOUS MONITORING OF ABLATION

(75) Inventor: Jay J. Brandinger, Pennington, NJ (US)

(73) Assignee: Westar Photonics Inc., Pennington, NJ (US)

( * ) Notice: Subject to any disclaimer, the term of this patent is extended or adjusted under 35 U.S.C. 154(b) by 203 days.

(21) Appl. No.: 09/865,939

(22) Filed: May 25, 2001

(65) Prior Publication Data

US 2001/0045690 A1 Nov. 29, 2001

Related U.S. Application Data

(60) Provisional application No. 60/207,041, filed on May 25, 2000.

(51) Int. Cl.[7] ............................................. B23K 26/00
(52) U.S. Cl. .................. 264/400; 264/482; 219/121.71; 219/121.74; 219/121.75; 219/121.77; 219/121.81; 219/121.83
(58) Field of Search ................................ 264/460, 482; 219/121.7, 121.71, 121.8, 121.81, 121.83, 121.23, 121.74, 121.75, 121.77

(56) References Cited

U.S. PATENT DOCUMENTS

| | | | |
|---|---|---|---|
| 4,508,749 A | | 4/1985 | Brannon et al. |
| 5,236,551 A | | 8/1993 | Pan |
| 5,286,947 A | * | 2/1994 | Clyde et al. ............ 219/121.83 |
| 5,593,606 A | * | 1/1997 | Owen et al. ............ 219/121.71 |
| 5,691,541 A | * | 11/1997 | Ceglio et al. ............ 250/492.1 |
| 5,841,099 A | * | 11/1998 | Owen et al. ............ 219/121.69 |
| 5,843,363 A | * | 12/1998 | Mitwalsky et al. ......... 264/400 |
| 6,037,564 A | * | 3/2000 | Tath ........................ 219/121.7 |
| 6,103,992 A | * | 8/2000 | Noddin ................... 219/121.71 |
| 6,215,094 B1 | * | 4/2001 | Dausinger et al. ..... 219/121.62 |
| 6,407,363 B2 | * | 6/2002 | Dunsky et al. ........ 219/121.71 |
| 6,441,337 B1 | * | 8/2002 | Isaji et al. ............. 219/121.62 |

* cited by examiner

Primary Examiner—Stefan Staicovici
(74) Attorney, Agent, or Firm—Synnestvedt, Lechner & Woodbridge LLP; Richard C. Woodbridge, Esq; Roy Rosser

(57) ABSTRACT

A maskless patterning apparatus allows for laser beam ablation of one or more layers of material while not etching an underlying different material layer. A micromirror array produces the desired complex pattern on the workpiece and a continuous feature and end point detection system provides location and material parameter changes to accurately control the pattern position and depth of etching. End point detection includes monitoring energy reflected from a specially prepared replica of the material to be ablated, whose thickness and consistency match the active workpiece area. The process terminates when the proper amount of material is removed.

13 Claims, 14 Drawing Sheets

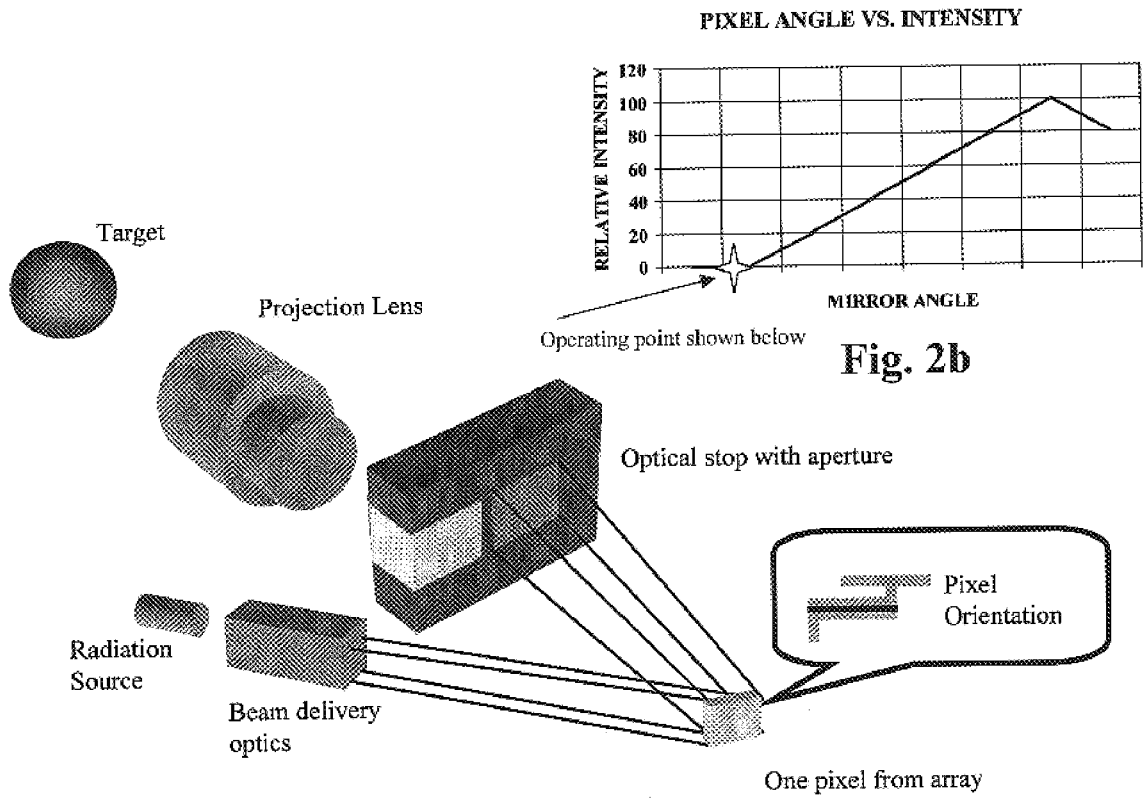

Ablation Process

UV Micromirror Exposure

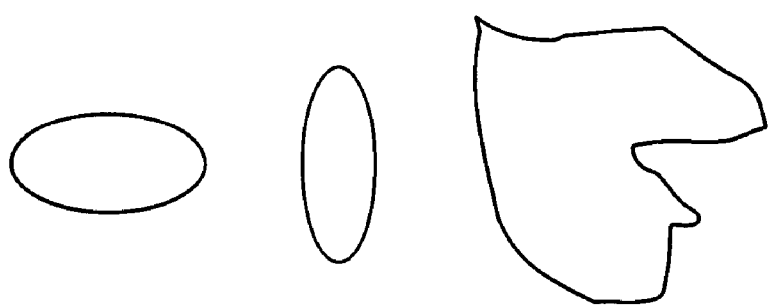

MASKLESS LASER BEAM PATTERNING ABLATION OF MULTILAYERED STRUCTURES WITH CONTINUOUS MONITORING OF ABLATION

CROSS REFERENCE TO RELATED APPLICATIONS

This application claims the priority of provisional U.S. Application Serial No. 60/207,041 filed on May 25, 2000 and entitled "A Maskiess Laser Beam Patterning Device and Apparatus for Ablation of Multilayered Structures with Continuous Monitoring of Ablation" by Jay J. Brandinger, the entire contents and substance of which are hereby incorporated in total by reference.

BACKGROUND OF THE INVENTION

1. Field of the Invention

This invention relates to an apparatus and method for laser machine ablation to produce complex patterns suitable for the rapid and accurate patterning of one or more layers of material while not etching an underlying different material layer.

2. Description of Related Art

The use of ablation patterning of various materials including polymers is well known. U.S. Pat. No. 4,508,749, Brannon et al., for example, discloses the use of ultraviolet radiation for etching through a polyimide layer. This patent is aimed at producing tapered openings through the polyimide layer to expose an underlying metal layer so that an electrical connection can be made to the metal. U.S. Pat. No. 5,236,551, issued for Pan describes the use of ablation etching to pattern a polymetric material layer that is then used as a mask for etching patterns in an underlying metal layer with chemical etchants.

Polymeric materials have high absorptivity in the region, UV and limited thermal diffusivity, limiting spread of absorbed energy, and facilitating energy density build up in the desired volume of material, and explosion of the material when threshold is exceeded. The ablation process stops automatically when the low absorptive, high thermal diffusivity metallic layer is exposed. The above patents do not disclose the desirable ablation etching of low UV absorptive dielectric materials used in the manufacture of semiconductor devices, e.g. silicon dioxide and silicon nitride, which may also be used in combination with polyimides.

Ablation of low absorptive dielectric materials requires radiant energies approaching those needed to ablate metals, which in turn limits ablation process selectivity. This is the problem Mitwalsky et al. solved in U.S. Pat. No. 5,843,363 which describes ablation etching of a pattern through one or more dielectric layers overlying a conductive material to provide electrical contact access through aligned openings. The principle disclosed to terminate ablation at successive layers involves end point detection including monitoring material specific emission, changes in surface reflectivity, and material ions. Other methods described include predictive end points using a specific number of laser energy pulses, changing the absorptive characteristics of the dielectric material by changing the radiation wavelength, and darkening the material to increase absorption.

A limitation of the prior art inventions described above is the use of an electrically conductive metallic underlying layer and the use of physical masks to define ablation etch patterns. In many patterning processes the underlying base material is not metallic but the need to terminate ablation etching at intermediate layers of different materials is needed. Further, the creation of physical masks is time consuming and costly. Thus, there is a clear need for an economical, programmable system to rapidly create and change ablation patterns. There is also a need for a means to accomplish end point layer detection including time, layer thickness, reflectivity and quantity of material removal. An ability to flexibly arrange alternate material layers and to create arbitrary ablation patterns could significantly reduce process time and cost.

SUMMARY OF THE INVENTION

Briefly described, the invention comprises an apparatus and method for laser machine ablation to produce complex patterns suitable for the rapid and accurate patterning of one or more layers of material while not etching an underlying different material layer. The invention combines the functions of a programmable thin film micromirror array to produce a maskless pattern for material ablation and a monitoring system to rapidly correct workpiece positional errors and accurately control material removal.

The preprogrammed thin film micromirror array (TMA) has individually addressable and moveable mirrors capable of redistributing the laser output beam energy to produce a desired two-dimensional machining pattern. Simple and complex predetermined energy patterns can be created and rapidly changed. Different patterns can be generated on successive laser energy pulses both in energy distribution and geometric location, to create accurate, complex three-dimensional machining of a workpiece, not easily achieved by conventional machining techniques. An electronic tracking system is included to precisely align the laser energy patterns with workpiece features/indices and to continuously monitor the removal of material from the workpiece.

The invention may be more fully understood by reference to the following drawings.

BRIEF DESCRIPTION OF THE DRAWING

FIG. 2 illustrates the operation of a single undeflected micromirror.

FIG. 10 illustrates three different complex patterns which can be created.

DETAILED DESCRIPTION OF PREFERRED EMBODIMENT

During the course of this description like numbers will be used to identify like elements according to the different views that illustrate the invention.

Figure 1:
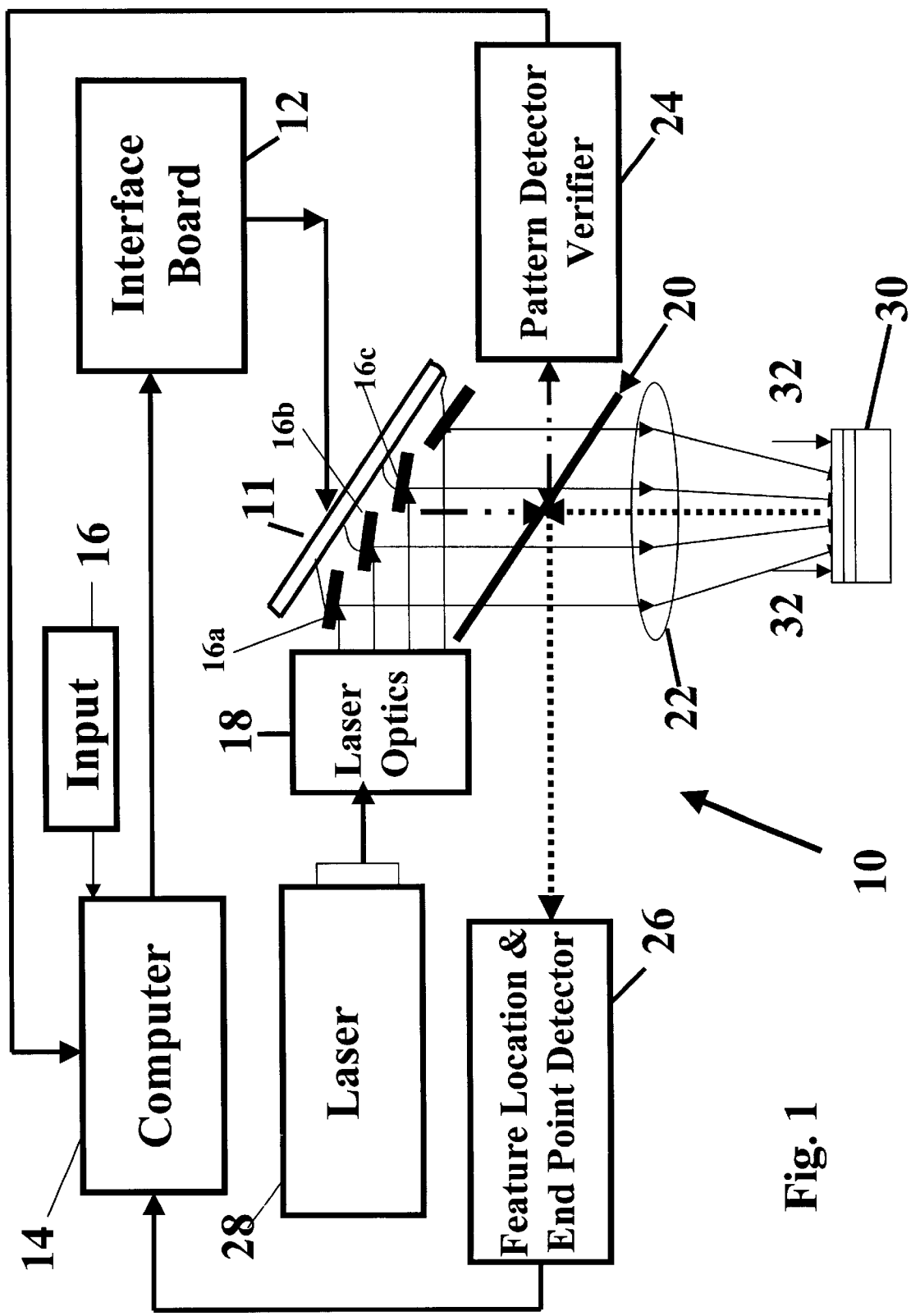
FIG. 1 is a schematic diagram of a preferred embodiment of the ablation apparatus of the present invention.

FIG. 1 shows a schematic diagram of a preferred embodiment 10 of the maskless laser beam apparatus of the present invention. The apparatus includes a thin-film micromirror array 11, an interface board 12, a computer 14, a computer input 16, laser optics 18, beam splitter 20, re-imaging optics 22, pattern detector and verifier 24, feature location & end point detector 26, and a laser 28. Operationally, a laser beam emanating from laser 28 is split into a plurality of laser beamlets by laser optics 18, and then modulated and reflected by individual micromirrors 11a,b,c . . . through re-imaging optics 20 onto the surface of workpiece 30.

Figure 4:
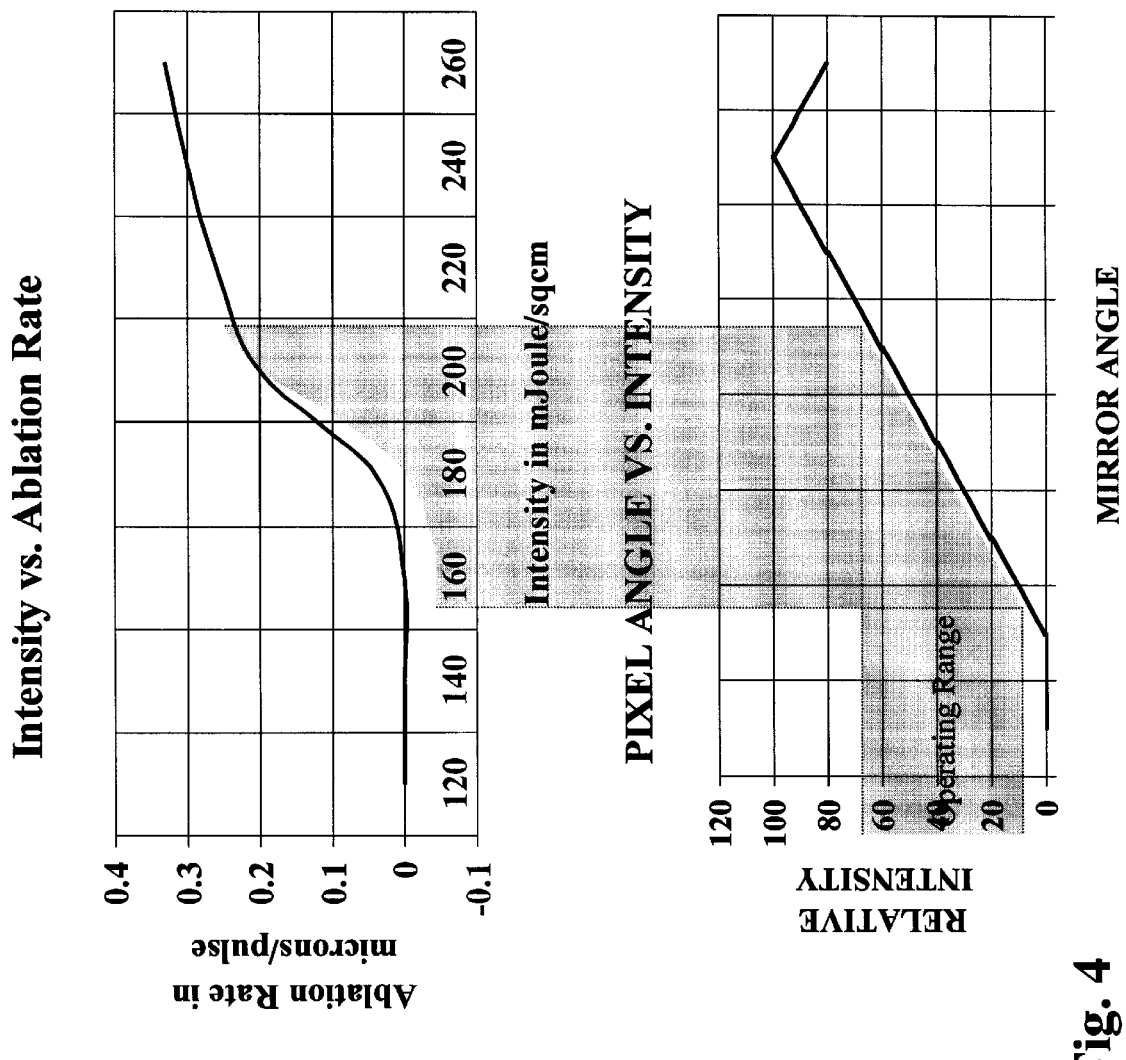
FIG. 4 illustrates the relationship between intensity and ablation rate.

A key element of this apparatus is the thin-film micromirror 11, which has a plurality of individual micromirrors 11a,b,c . . . , each of which can be individually tilted with respect to incident laser beamlets as depicted in FIG. 1. Individual control of the tilting of each micromirror 11a,b,c . . . allows for modulation the energy of each beamlet before reflection onto the surface of workpiece 30. When the mirror is not tilted, the laser energy is substantially blocked from the imaging optics 22. As the mirror angle increases the amount of energy directed toward the workpiece is increased, reaching a maximum at maximum tilt angle. The amount of energy that passes through to the work piece is linearly proportional to the tilt angle of each mirror as illustrated in FIGS. 2a,b (not tilted) & 3a,b (partially tilted). FIG. 4 is a graph of the relationship between energy intensity and typical ablation rate.

The orientation of each individual micromirror 11a,b,c . . . is controlled by input 16 from computer 14 via an interface board 12, to create a plurality of reflected beamlets having a defined spatial energy density distribution pattern. A series of different patterns can be sequentially imaged onto workpiece 30 to achieve a desired ablation pattern.

Figure 5:
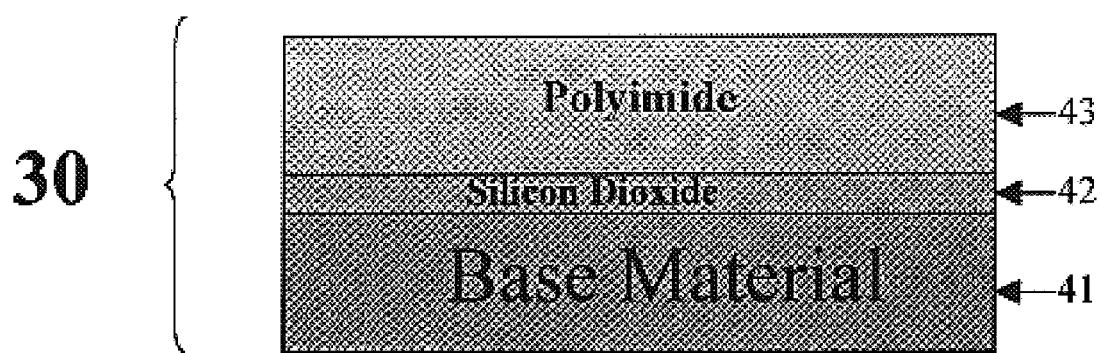
FIG. 5 depicts a cross-section of a multi-layered workpiece prior to ablation.

A specific example of an ablation process as described above is illustrated in FIGS. 5–8. A multi-layered structured workpiece 30 as illustrated in FIG. 5 includes a base material 41 such as semiconductor material silicon or gallium arsenide, on top of which is a dielectric layer of silicon dioxide 42. On top of the silicon dioxide is a covering layer 43 of polyimide. Other dielectric materials including silicon nitride and other polymeric materials maybe substituted for the various layers.

Figure 6:
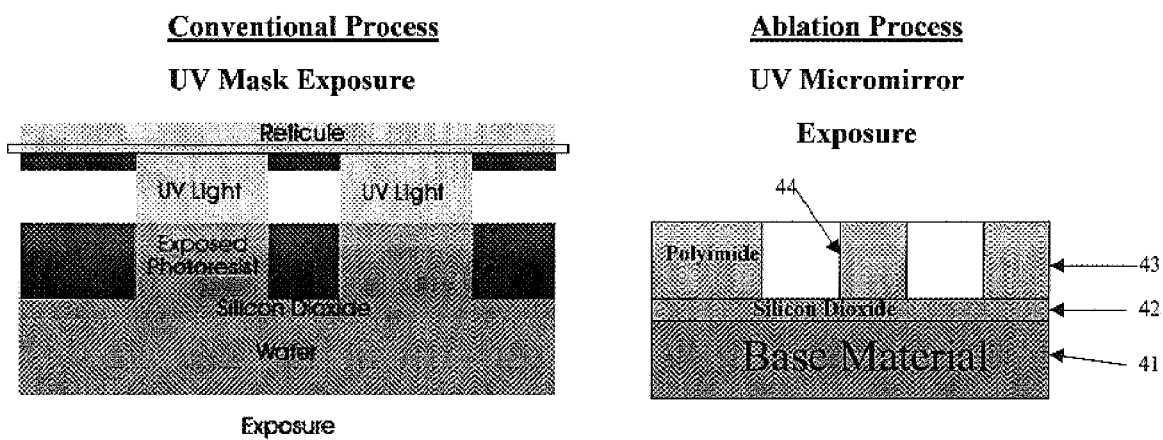
FIG. 6 depicts the multi-layered work piece of FIG. 5 with the polyimide layer removed.

FIG. 6 illustrates how conventional UV mask exposures are performed to develop patterns using chemically processed photoresist. Etch patterns through the photoresist selectively expose silicon dioxide for further processing. Using the ablation apparatus of the present invention, the two layers 42 and 43 are selectively ablated with little or no etching of the underlying base material 41 as shown in FIG. 6. as is also seen in FIG. 6, the polyimide layer 43, is selectively ablated, exposing silicon dioxide 42 directly without chemical processing.

Figure 7:
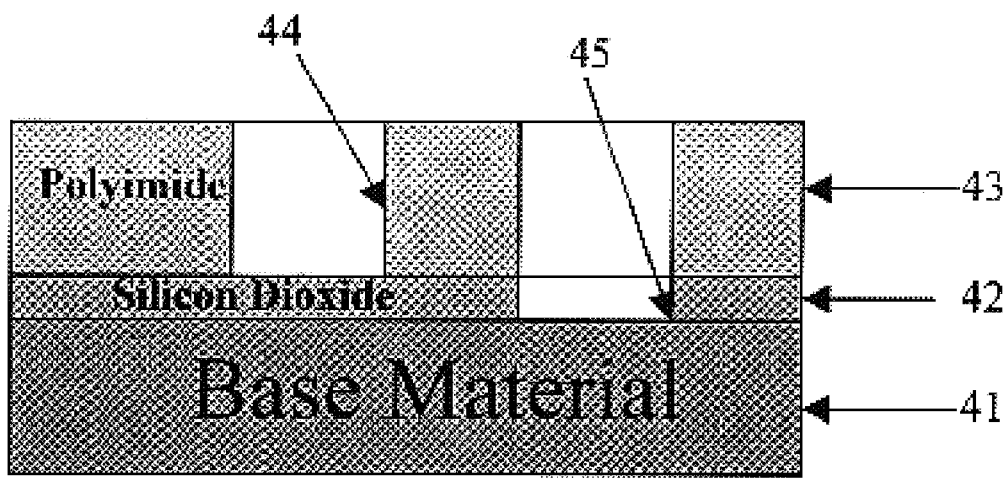
FIG. 7 illustrates different ablation patterns at different locations on the multilayered workpiece of FIG. 5 in contrast to a conventional process using photoresist.

FIG. 7 shows how the ablation process in one area 44 can be terminated after removal of the polyimide layer 43, while the ablation process can continue through the silicon dioxide layer 45 to the base material 41 in another area 45, and that ablation can be terminated in this area with little or no etching of the underlying base material.

Figure 8:
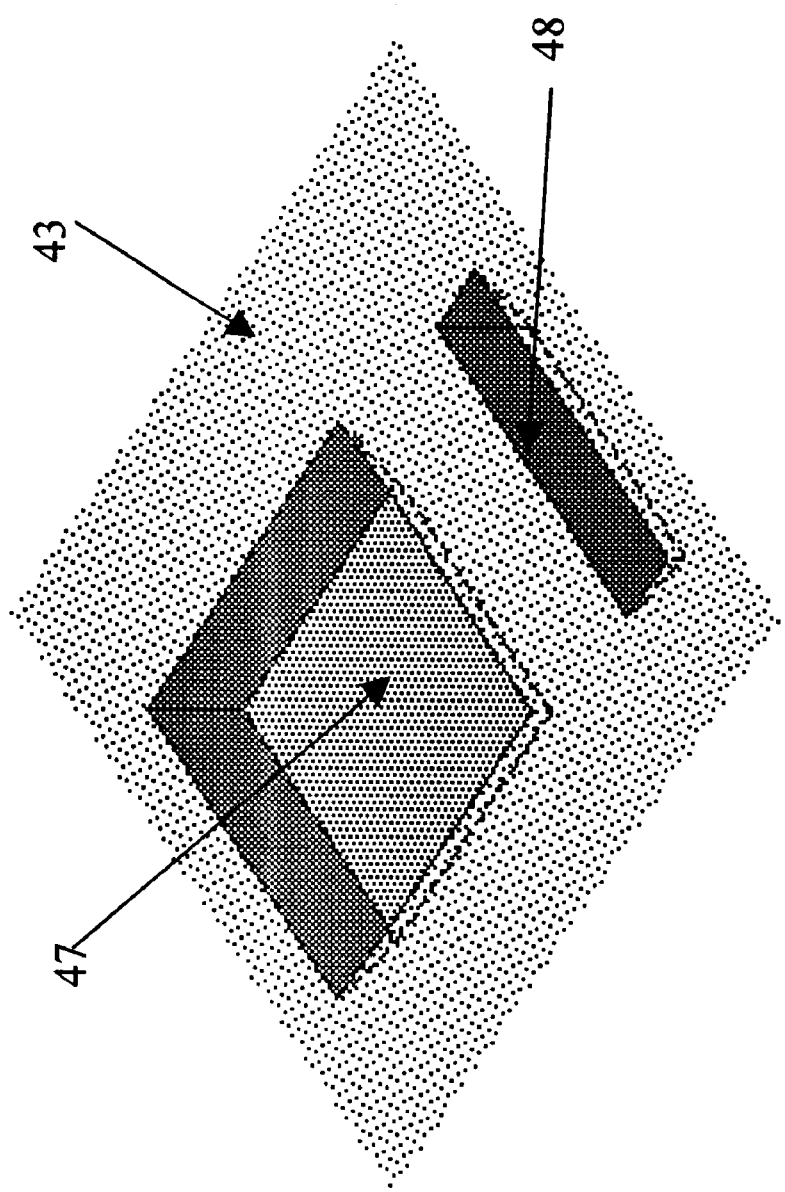
FIG. 8 is a perspective drawing illustrating different ablation patterns at different locations on the multi-layered workpiece of FIG. 5.

FIG. 8 is a perspective view of the resulting ablation etching in selective regions of the work piece. The well 47 depicts the region 45 ablated through the polyimide layer 43 and silicon dioxide 42 layers of FIG. 6, while well 48 depicts the region selectively ablated through the polyimide layer 43 down to the silicon dioxide layer 42.

Polymeric materials generally require relatively low ablation energy densities, e.g. around 200 mJ/cm$^2$ per pulse. Energy pulses with a width of about 20 ns and a repetition rate of 200 Hz to 20 KHz typically will have an etch rate of about 0.1 micron/pulse for polyimide. Silicon dioxide and silicon nitride have significantly higher thresholds for ablation. Thus, energy densities of 600 mJ/cm$^2$ are typically required.

An important part of this invention is the termination of the process in localized areas at different layers to produce complex ablation patterns. The use of an addressable thin film micromirror array 11 permits changing of the ablation etch pattern on successive laser pulses. Thus, if in one area of the workpiece it is desired to remove only the top layer and in another area the removal of all layers down to the base material, the end point monitor would detect and terminate the ablation etch process when the top layer is removed and the ablation etch process continued in the other area until the end point monitor terminated the process at the base material.

Typical end point detection processes known in the art and of use in the present invention include:

1) establishing ablation time/pulses versus depth for specific deposited materials in the layers,
2) establishing depth of the ablated layer optically between laser pulses using surface reflection as compared with the measurement of the layer depth in unablated areas,
3) establishing changes in reflectivity at the boundary of dissimilar layer materials,
4) measuring the amount of material removal by measuring its re-deposition on another substrate,
5) measurement of changes in material composition spectroscopically,
6) using separately deposited layer materials with the same thickness and composition as that used on the work piece overlaying metallic base materials to monitor the ablation etch process.

Figure 9:
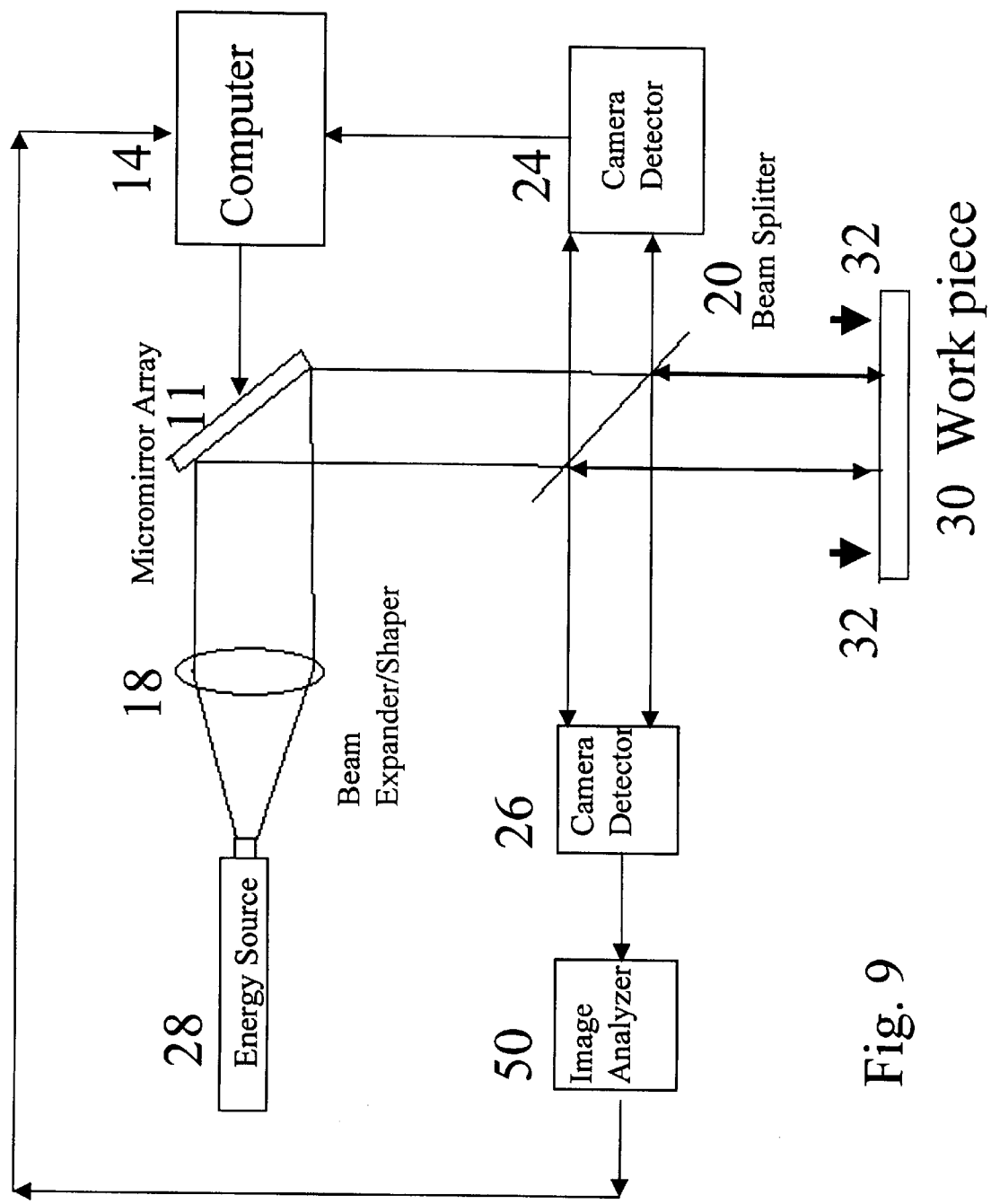
FIG. 9 is a schematic diagram depicting a electronic tracking system.

FIG. 9 illustrates a particular embodiment of the invention that accomplishes two dimensional translation of an energy source to track changes in the desired location of the energy application. The tracking technique includes a method for identifying the location of the desired position for application of the energy and feeding back that location to the two dimensional tracking device. Separately, the energy source is shaped to produce the desired pattern for energy application at the desired location as described above in relation to FIG. 1.

As shown in FIG. 9, the energy source 28 is passed through a beam expander/homogenizer 18 to fill the field of the two dimensional micromirror array 11, an area larger than the desired energy application area imaged on the work piece 30. The computer 14 sets only a portion of the micromirrors in the array to fill the desired two-dimensional shape required with the predetermined energy distribution. Alternate outline shapes of patterns on the work piece can be simple or complex and the energy distribution within boundaries of these patterns may be simple or complex as illustrated in FIG. 10.

The patterned image generated by micromirror 11 is passed through the beam splitter 20 to the workpiece 30. The reflected image pattern from the workpiece is reflected by the beam splitter 20 to the camera detector 26 which in turn feeds the image analyzer 50. The workpiece index marks 32 are also seen by the camera detector 26 and are similarly available to the image analyzer 50. The image analyzer 50 establishes the relative position of the workpiece 30, index marks 32, and an energy pattern such as one depicted in FIG. 10. If the workpiece 30 shifts its position, the relative position of the workpiece index marks 32 and the energy pattern changes. This location change information is fed to computer 14, which in turn resets the micromirror array 11 to reposition the energy pattern on the work piece 30 to reduce the displacement relative to the work piece index marks to an acceptably small error or zero. Camera detector 24 feeds the computer 14, the image of the micromirror array 11, from the beam splitter 20, to analyze and confirm the position and predetermined energy pattern integrity.

It should be noted that this electronic tracking system and pattern shaping invention trades source energy to accomplish tracking, i.e. if $A_1$ is the area of the energy pattern desired, and $A_2$ is the total area of the micromirror array illuminated by the source, the energy efficiency of the system is degraded by $A_1/A_2$. The key advantages of this approach include: that random energy application pattern shapes and rapid correction of location shifts can be accomplished much more rapidly than with conventional electromechanical systems.

An alternate implementation of this invention mounts the micromirrors on an electromechanical gimbal that is driven by the computer 14 to reduce the displacement relative to the workpiece index marks to an acceptably small error or zero. The advantage of this approach is to eliminate the efficiency loss cited above, since all of the energy illuminating the micromirrors is used within the predetermined pattern on the work piece.

Similarly, it is possible to accomplish the tracking by using other eletromechanical means including galvanometer mirror systems, and solenoid actuators.

Thin-film micromirror arrays 11 suitable for use in the present invention are made by Daewoo Electronics Co. Ltd. Korea under the trademark "Thin-film Micromirror Array (TMA).

The TMA, thin-film micromirror array 11, is an array of 1024×768 mirrors, each mirror measuring 49 microns×49 microns, with a panel size of 2.54 inches diagonal. The TMA is a reflective spatial modulator used to modulate light in television video projection. It is a suitable device for the ablation patterning with appropriate modifications to operate at UV wavelengths including UV grade optics and UV reflective mirrors.

Figure 11A:
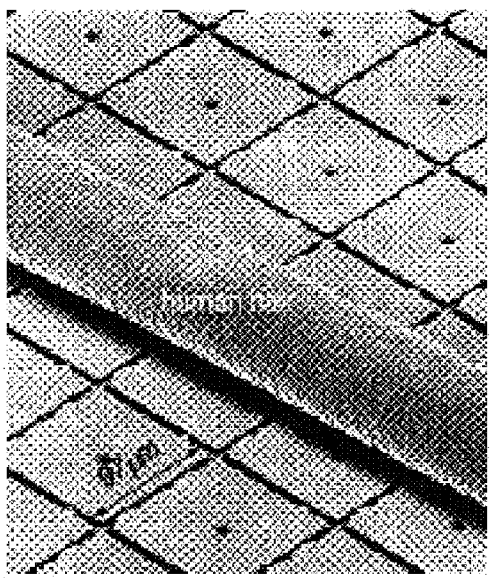
FIG. 11a is a photomicrograph of a TMA mirror array with a human hair superimposed to show scale
Figure 11B:
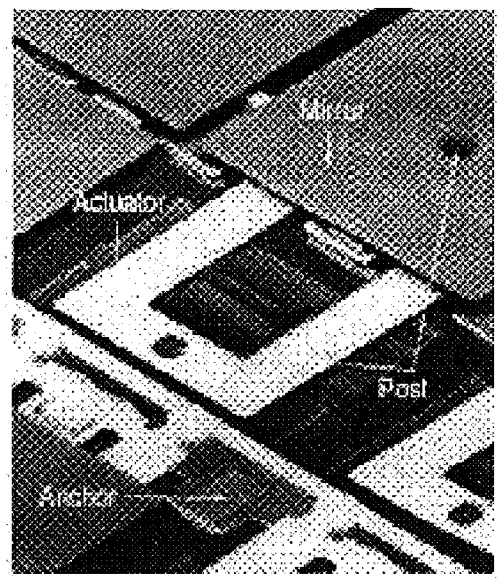
FIG. 11b shows the underlying actuator.
Figure 12:
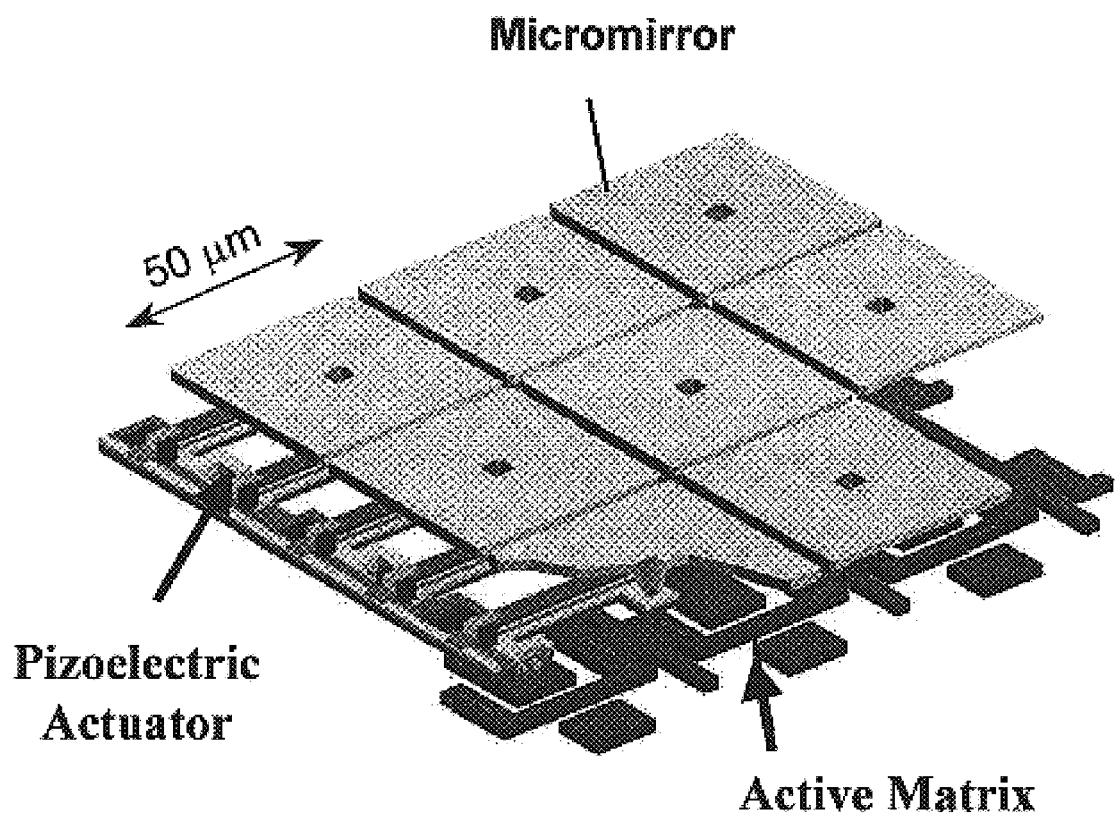
FIG. 12 is a schematic diagram of a TMA mirror array.

Each TMA pixel is a monolithically integrated MEMS (Microelectromechanical Systems) device fabricated over a simple PMOS switch as illustrated in FIG. 11a. The pixel size in this earlier version is 97 microns by 97 microns. Each pixel consists of a micromirror and an actuator as shown in FIG. 11b. Each aluminum mirror has high reflectivity and excellent flatness for high optical efficiency, and the actuator has linear and fast response times, as well as mechanical and electrical reliability. It is also understood that micromirror array 1 can be replaced by other reflective/transmissive mask devices including patterned foil devices. FIG. 12 illustrates the TMA array structure.

Figure 13:
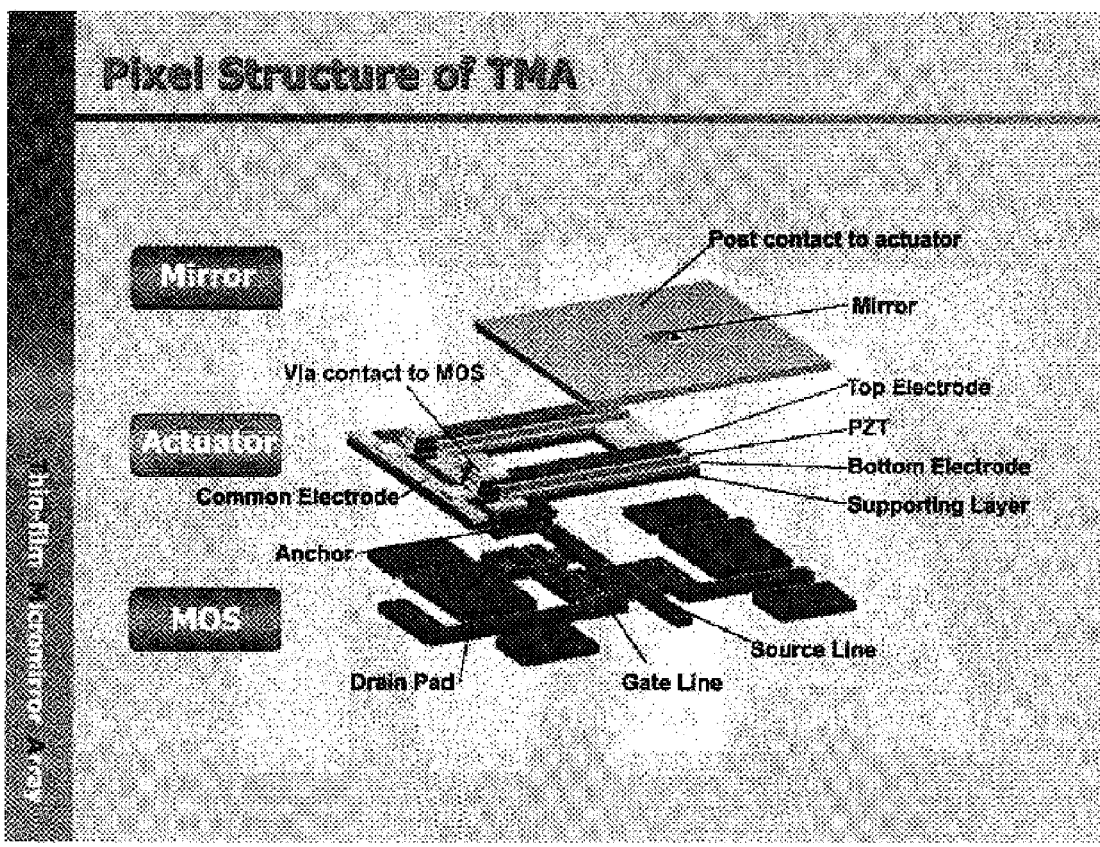
FIG. 13 is an exploded view of the TMA mirror array of FIG. 13.

The TMA uses thin film piezoelectric actuators in the form of micro-cantilevers. As shown in FIG. 13, a mirror is connected to the cantilevers themselves through a support post. The cantilevers themselves are anchored to the underlying substrate. A cantilever consists of the supporting layer, bottom electrode, piezoelectric layer, and top electrode. When an electric field is applied between the common electrode and the bottom electrode, the piezoelectric layer shrinks in the horizontal direction and expands in the vertical direction.

Figures 3A, 3B:
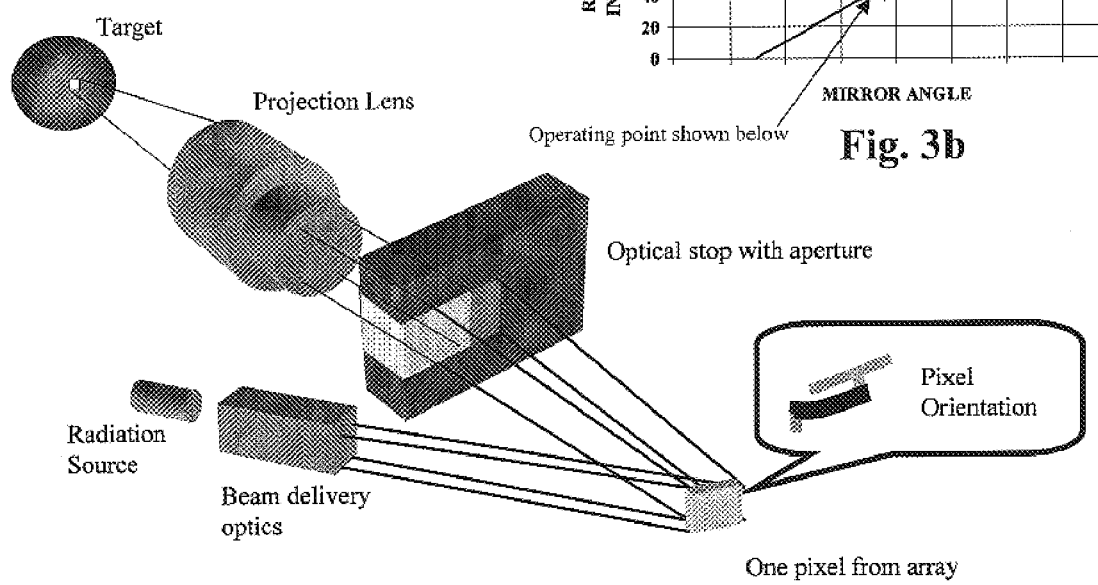
FIG. 3 illustrates the operation of a single partially deflected micromirror.
Figure 14:
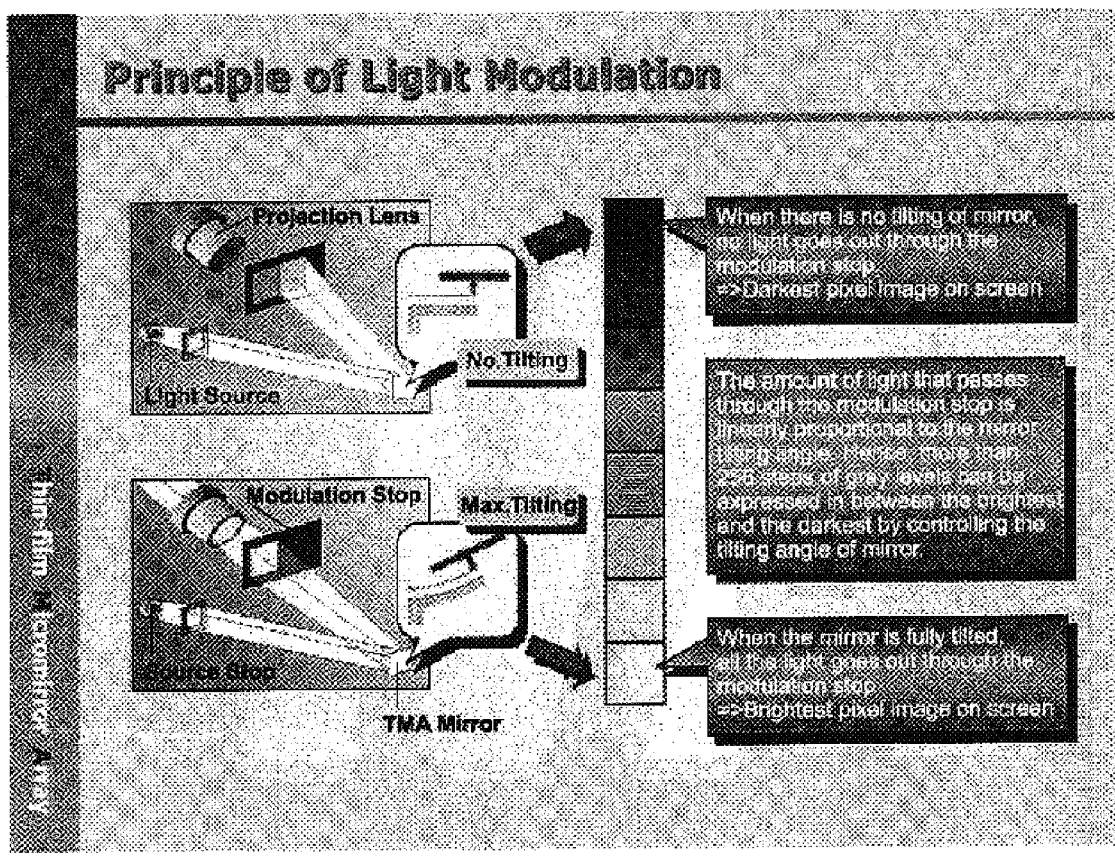
FIG. 14 illustrates the principle of light modulation by the TMA micromirror array.

Since the neutral plane of the cantilever shifts toward the bottom of the electrode due to thickness of the supporting layer, the mechanical strain of the piezoelectric layer causes vertical deflection of the cantilever and a tilt of the mirror on top of it. FIG. 14 shows the effect of tilting the mirror. When there is no tilt, no light goes out of the modulation stop and when maximum defection of the mirror is achieved, the maximum amount of light is passed by the modulation stop. FIGS. 2 and 3 detail the operation of one pixel in the undeflected and partially deflected positions. As is shown in graph 2b, the mirror deflection angle determines the amount of light that pass through the modulation or optical stop. In the case of the TMA, the piezoelectric material operates from 0 to 10 volts and the corresponding mirror deflection is from 0 to about 10 degrees.

It is also understood that other reflective mirror masks may be substituted for the micromirror array 11. Other micromirror array manufacturers include Texas Instruments and Standard MEMS. One such system is a foil array of patterns, sequentially changed to modify the ablation etches on successive layers of a multi-layered structure as illustrated in FIGS. 7 and 8. It is also understood that the work piece 30 may consist of tissue. One such tissue system is an eye, whose corneal tissue is ablated to modify its refractive properties, e.g. photorefractive keratectomy.

While the invention has been described with reference to the preferred embodiment thereof, it will be appreciated by those of ordinary skill in the art that modifications can be made to the structure and elements of the invention without departing from the spirit and scope of the invention as a whole.

What is claimed is:

1. A process for machining a multi-layered work piece comprising at least a base layer, and a first layer of material of a dissimilar material on the surface of said base layer and preferably, a second layer of material of a dissimilar material to said first layer, said process consisting of the steps of:

(a) ablation etching a complex, three-dimensional pattern of openings into said work piece by directing radiant energy of a given energy against said composite work piece;

(b) generating, by using a computer, a maskless complex pattern and projecting said pattern onto said work piece using a Digital Micro Device (DMD) micromirror structure;

(c) continuously monitoring selected parameters from said work piece; and, (d) selectively terminating said ablation etching in at least one localized area, in accordance with said complex pattern, upon reaching the predetermined level of material removal in said localized area as detected in said monitoring step, thereby allowing said ablation etching to be selectively stopped upon reaching said predetermined level, independent of process conditions, while continuing ablation etching in at least another localized area to form said three-dimensional pattern of openings, whereby said complex three-dimensional pattern of openings is etched into said work piece.

2. The process according to claim 1 wherein said monitoring step consists of:

detecting changes as a function of time, in a parameter selected from the group consisting of depth of layer, change in reflectivity of layer and quantity of material deposited on surrounding area.

3. The process according to claim 2 wherein said step of selectively terminating said ablation etching comprises the step of:

discontinuing the directing of radiant energy against the work piece within said at least one localized area.

4. The process according to claim 3 wherein said first layer material is selected from the group consisting of silicon dioxide and silicon nitride.

5. The process according to claim 4 wherein said second layer is a non-polymeric material.

6. A process for maskless, complex, pattern machining of a multi-layered work piece comprising at least a base layer, and a first layer of material of a dissimilar material on the surface of said base layer and preferably, a second layer of material of a dissimilar material to said first layer, said process consisting of the steps of:

(a) ablation etching a three-dimensional pattern of openings partway into said work piece by directing an ablation etch pattern of radiant energy of a first energy level against said multi-layered work piece, using a computer addressable micromirror array;

(b) providing a second beam of incident energy with an energy level sufficiently low so as to prevent ablation;

(e) continuously monitoring said work piece, using said second beam, with a detector located so as to determine the desired depth of ablation;

(f) calculating, using a computer, the differences between the measured depth of ablation and the desired ablation; and (g) selectively stopping said ablation etching in at least one localized area upon reaching a desired depth of ablation in said localized area, by changing said ablation etch pattern using said addressable micromirror array, while continuing ablation etching in at least another localized area, whereby said three-dimensional pattern of openings is etched in said surface of said work piece.

7. The process according to claim 6 wherein said first energy level of said first beam of radiant energy is sufficiently high for ablation etching of said base layer of said work piece.

8. The process according to claim 7 wherein said work piece is comprised of an additional layer overlying said first layer prior to said ablation etching and wherein said ablation etching creates openings through both said first layer and said overlying layer.

9. The process according to claim 6 wherein said step of directing an ablation etch pattern of radiant energy of a first energy level against said work piece, using a computer addressable micromirror array wherein said computer is programmable and said micromirror array mirrors are individually addressable and movable mirrors, programmed to produce the desired array pattern for ablation etching said composite work piece.

10. The process according to claim 9 wherein said directing said radiant energy against said composite work piece includes the use of a programmable modulating apparatus including a computer connected to a high resolution light valve or switch arrays having individually addressable elements, programmed to produce the desired array pattern for ablation etching said composite work piece.

11. The process according to claim 10 wherein said step of directing said radiant energy against said work piece further including the step of: moving a said beam of radiant energy across said work piece in discrete steps.

12. A process for pattern machining a multi-layered work piece comprising at least a base layer, and a first layer of material of dissimilar material on the surface said base layer and preferably, a second layer of material of a dissimilar material to said first layer, said process consisting of the steps of:

(a) ablation etching a three-dimensional pattern of openings into said work by, directing a first beam of radiant energy having a first energy level and a first ablation pattern against said work piece;

(b) directing a second beam of radiant energy with a second wavelength different from than said wavelength of said first beam of radiant energy incident on said composite work piece and with a second energy level which is below the ablation threshold to monitor the quantity and rate of material removal from said work piece;

(c) monitoring the quantity of material removal from said work piece to ascertain when said ablation etching process reaches said first layer;

(d) monitoring the rate of material removal from said work piece to ascertain when said ablation etching process reaches said first layer;

(e) altering said first ablation pattern to a second ablation pattern upon reaching said first layer, wherein said second ablation pattern selectively stops further ablation etching within at least one region of said first ablation pattern;

(f) monitoring the quantity of material removal from said work piece to ascertain when said ablation etching process reaches said base layer;

(g) monitoring the rate of material removal from said work piece to ascertain when said ablation etching process reaches said base layer; and, (h) stopping said ablation etching upon reaching said base layer, while continuing ablation etching in at least another region, whereby said three-dimensional pattern of openings is etched in said surface of said work piece.

13. A process for machining a multi-layered work piece comprising at least a base layer, and a first layer of material of a dissimilar material on the surface of said base layer and preferably, a second layer of material of a dissimilar material to said first layer, said process consisting of the steps of:

(a) monitoring selected parameters from said work piece;

(b) generating a working complex pattern of radiation, said working complex pattern of radiation being formed from a source of radiant energy by an addressable Digital Micro Device (DMD) micromirror structure under control of a computer using said monitoring selected parameters;

(c) ablation etching said working complex pattern of radiation into said work piece by projecting said working complex pattern of radiation onto said work piece; and, (d) repeating said steps of monitoring, generating and ablation etching, wherein said working pattern of radiation is generated such that said step of ablation etching is selectively terminated in at least one localized region of said desired pattern upon reaching a predetermined level of material removal in said localized region, as detected in said monitoring step, while continuing ablation etching in at least another localized region to another predetermined level of material removal until a desired three-dimensional pattern is etched into said work piece.

* * * * *